(12) United States Patent
Nielsen et al.

(10) Patent No.: US 12,171,072 B2
(45) Date of Patent: Dec. 17, 2024

(54) MOUNTING SYSTEM AND METHOD FOR SENSOR NODE

(71) Applicant: Dwellwell Analytics, Inc., Bethesda, MD (US)

(72) Inventors: Mikael Plougstrup Nielsen, Copenhagen (DK); Alexis Martin, Copenhagen (DK); Friedrich G. Geck, Mount Airy, MD (US); Daniel Simpkins, Bethesda, MD (US)

(73) Assignee: Dwellwell Analytics, Inc., Bethesda, MD (US)

( * ) Notice: Subject to any disclaimer, the term of this patent is extended or adjusted under 35 U.S.C. 154(b) by 0 days.

(21) Appl. No.: 17/589,320

(22) Filed: Jan. 31, 2022

(65) Prior Publication Data
US 2023/0247780 A1 Aug. 3, 2023

(51) Int. Cl.
*H05K 5/02* (2006.01)
*H01R 33/06* (2006.01)

(52) U.S. Cl.
CPC .......... *H05K 5/0204* (2013.01); *H01R 33/06* (2013.01); *H05K 5/0247* (2013.01)

(58) Field of Classification Search
CPC .... H05K 5/0204; H05K 5/0247; H01R 33/06; H01R 13/6683
See application file for complete search history.

(56) References Cited

U.S. PATENT DOCUMENTS

| | | | | | |
|---|---|---|---|---|---|
| 4,467,263 | A * | 8/1984 | Conforti | ................ | F21L 4/085 |
| | | | | | 362/183 |
| 5,568,133 | A * | 10/1996 | Durrer | ................ | G08B 17/113 |
| | | | | | 340/693.11 |
| 5,808,556 | A * | 9/1998 | Nelson | ................ | H01R 13/113 |
| | | | | | 361/740 |
| 6,297,982 | B1 * | 10/2001 | Wu | ................ | H02M 7/003 |
| | | | | | 363/146 |
| 6,398,179 | B1 * | 6/2002 | Soles | ................ | F16F 9/0454 |
| | | | | | 248/617 |
| 7,140,922 | B2 * | 11/2006 | Luu | ................ | H01R 31/065 |
| | | | | | 439/651 |
| 7,490,800 | B2 * | 2/2009 | Tu | ................ | H05K 5/0204 |
| | | | | | 248/225.11 |

(Continued)

FOREIGN PATENT DOCUMENTS

EP 3958403 A1 * 2/2022 ............. H01F 27/02

OTHER PUBLICATIONS

Translation of EP-3958403-A1 (Year: 2022).*

*Primary Examiner* — Abhishek M Rathod
(74) *Attorney, Agent, or Firm* — Klintworth & Rozenblat IP LLP

(57) ABSTRACT

Example embodiments include a mounting system and method for a sensor node or other electrical or electronic device. An apparatus according to some embodiments includes a housing having a perimeter and a rear surface, a set of power plug prongs extending from the rear surface of the housing, and a bracket releasably engageable with the rear surface of the housing, the bracket having at least one flange that extends beyond the perimeter of the housing when the bracket is engaged with the rear surface. In some embodiments, at least one of the flanges includes a frangible region allowing for removal of at least a portion of the respective flange.

19 Claims, 9 Drawing Sheets

(56) References Cited

U.S. PATENT DOCUMENTS

| | | | | |
|---|---|---|---|---|
| 7,582,828 B2* | 9/2009 | Ryan | | H05K 5/0204 |
| | | | | 174/542 |
| 8,052,008 B2* | 11/2011 | Drane | | H02G 3/185 |
| | | | | 220/3.6 |
| 8,266,839 B2* | 9/2012 | Bernard | | A01M 1/2011 |
| | | | | 43/131 |
| 8,382,514 B1* | 2/2013 | Shapson | | H01R 24/525 |
| | | | | 439/528 |
| 8,459,472 B2* | 6/2013 | Hofman | | A47F 5/0815 |
| | | | | 211/106.01 |
| 9,240,817 B2* | 1/2016 | Shen | | H04B 1/3888 |
| 9,247,219 B2* | 1/2016 | Kasmir | | H04N 7/188 |
| 9,961,966 B2* | 5/2018 | Ryan | | A44B 1/14 |
| 10,041,639 B1* | 8/2018 | Thompson | | F21V 23/02 |
| 10,194,296 B2* | 1/2019 | Tetreault | | H04L 69/18 |
| 10,199,782 B1* | 2/2019 | Wengreen | | F16M 13/00 |
| 10,753,561 B2* | 8/2020 | Chien | | F21S 8/035 |
| 10,985,516 B1* | 4/2021 | Gartside | | H02G 3/14 |
| 11,228,735 B2* | 1/2022 | Chien | | H04N 7/181 |
| 11,495,924 B2* | 11/2022 | Stankovski | | H01R 13/502 |
| 11,594,124 B2* | 2/2023 | Kim | | H05B 47/105 |
| 11,632,520 B2* | 4/2023 | Chien | | F21V 21/08 |
| | | | | 362/642 |
| 11,737,550 B2* | 8/2023 | Williamson | | A45F 5/00 |
| | | | | 24/3.2 |
| 2004/0218411 A1* | 11/2004 | Luu | | H01R 31/065 |
| | | | | 363/146 |
| 2008/0105803 A1* | 5/2008 | Tu | | H05K 5/0204 |
| | | | | 248/220.22 |
| 2008/0110672 A1* | 5/2008 | Ryan | | H05K 5/0204 |
| | | | | 174/542 |
| 2011/0076876 A1* | 3/2011 | Fleisig | | H01R 25/003 |
| | | | | 439/501 |
| 2011/0076880 A1* | 3/2011 | Fleisig | | H01R 43/26 |
| | | | | 439/501 |
| 2013/0099009 A1* | 4/2013 | Filson | | H04L 67/10 |
| | | | | 236/1 C |
| 2015/0130621 A1* | 5/2015 | Seiler | | H01R 33/72 |
| | | | | 340/628 |
| 2015/0138747 A1* | 5/2015 | Chiang | | H05K 5/0204 |
| | | | | 174/481 |
| 2015/0319411 A1* | 11/2015 | Kasmir | | H04N 7/186 |
| | | | | 340/328 |
| 2018/0279492 A1* | 9/2018 | Svedberg | | H05K 5/0204 |
| 2019/0172332 A1* | 6/2019 | Kraz | | G08B 17/113 |
| 2019/0357339 A1* | 11/2019 | Kim | | H05B 47/105 |
| 2021/0336394 A1* | 10/2021 | Stankovski | | H01R 24/76 |
| 2022/0007820 A1* | 1/2022 | Williamson | | A45F 5/02 |
| 2023/0133082 A1* | 5/2023 | Stankovski | | H01R 13/73 |
| | | | | 439/373 |

* cited by examiner

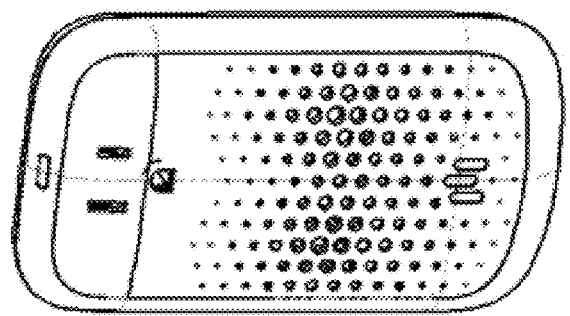
FIG. 1E
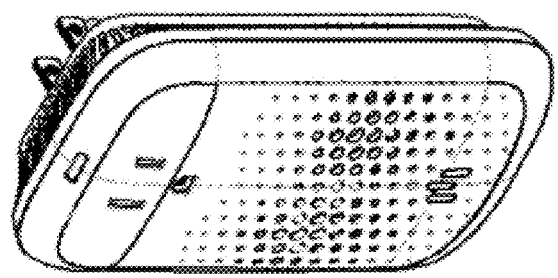
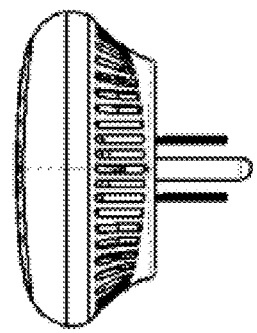
FIG. 1F
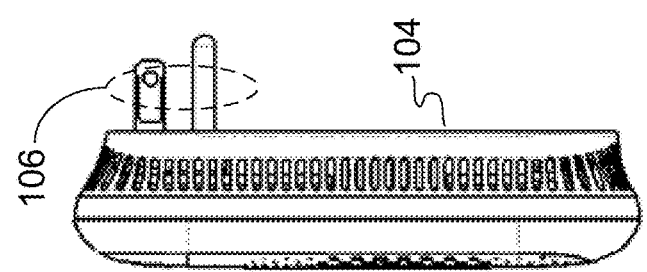
FIG. 1D
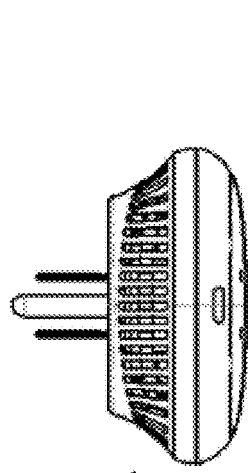
FIG. 1A
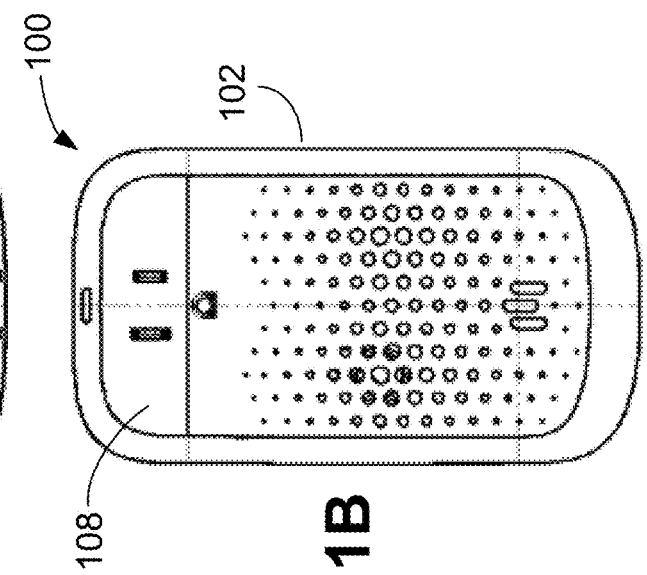
FIG. 1B
FIG. 1C

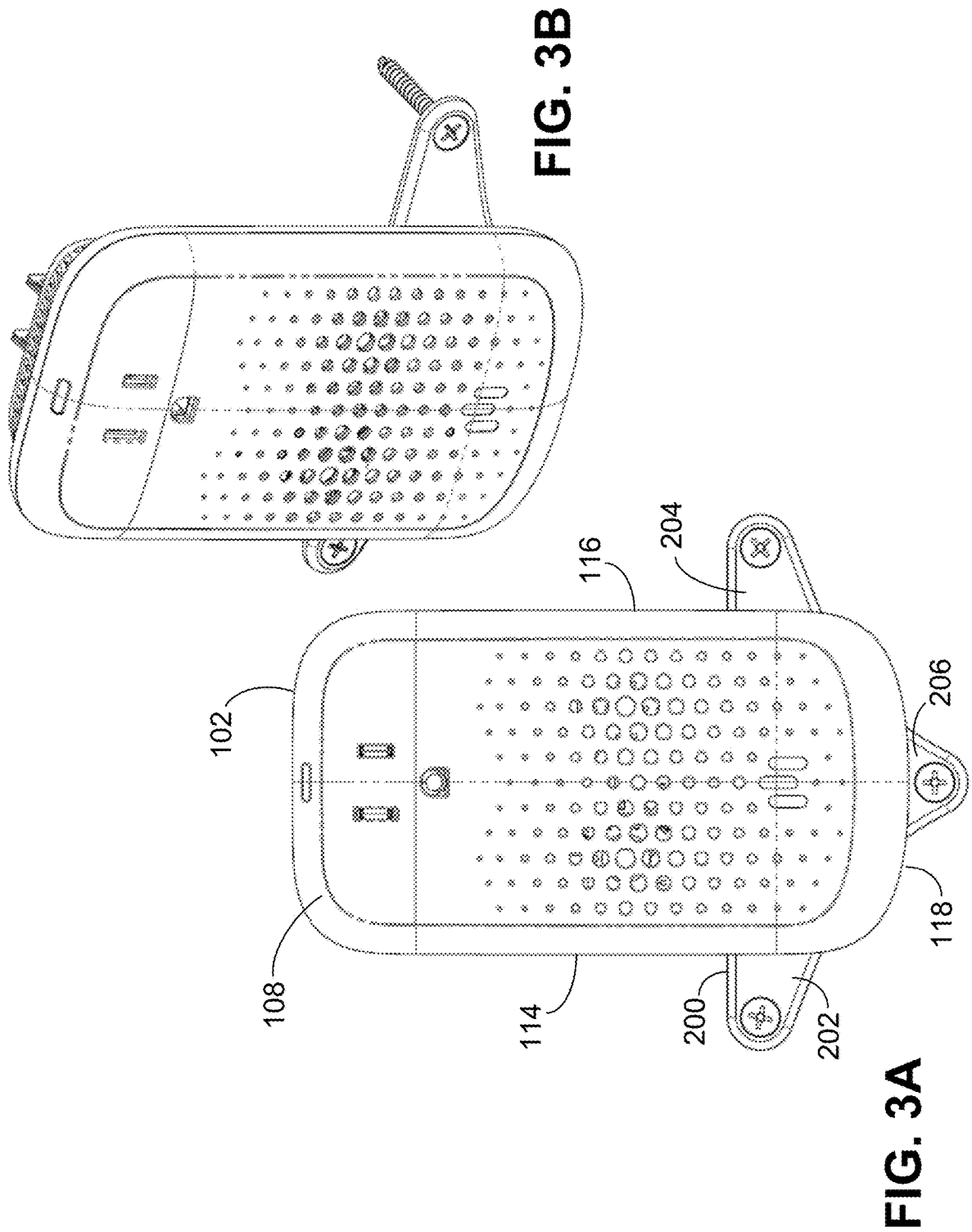

MOUNTING SYSTEM AND METHOD FOR SENSOR NODE

BACKGROUND

The present disclosure relates to a mounting system and method for an electric or electronic device, such as a sensor node, that is engageable with an alternating current (AC) power outlet.

SUMMARY

An apparatus according to some embodiments includes a housing having a perimeter and a rear surface. A set of power plug prongs extends from the rear surface of the housing. A bracket is releasably engageable with the rear surface of the housing, the bracket having at least one flange that extends beyond the perimeter of the housing when the bracket is engaged with the rear surface.

In some embodiments, the housing encloses a sensor node. The sensor node may include at least one of the following: an accelerometer, a thermometer, a light sensor, and a microphone.

In some embodiments, the releasable engagement between the housing and the bracket is a rotatable engagement.

In some embodiments, the bracket includes a first set of at least two projections, and the rear surface of the housing includes a second set of at least two projections, the first set of projections being releasably engageable with the second set of projections.

In some embodiments, the bracket is releasably engageable with the rear surface in at least two orientations. For example, the bracket may be releasably engageable with the rear surface in a first orientation and in a second orientation that is rotated 180° with respect to the first orientation.

In some embodiments, the flange includes a mounting hole capable of accepting a screw, the mounting hole being at a position beyond the perimeter of the housing when the bracket is engaged with the rear surface.

In some embodiments, the bracket includes at least two flanges that extend beyond the perimeter of the housing when the bracket is engaged with the rear surface.

In some embodiments, at least one of the flanges includes a frangible region allowing for removal of at least a portion of the respective flange. The frangible region may include a scoring line or perforation, for example.

In some embodiments, the perimeter of the housing includes a first side edge, a second side edge, and a bottom edge, and the bracket includes three flanges including a first flange that extends beyond the first side edge, a second flange that extends beyond the second side edge, and a third flange that extends beyond the bottom edge.

In some embodiments, the flange includes a mounting hole, and when the bracket is engaged with the rear surface, the mounting hole is between 1 inch and 2½ inches from a centerline of the housing. In some embodiments, the mounting hole is between 1¼ inches and 2¼ inches from a centerline of the housing.

In some embodiments, the bracket is engageable with the rear surface in an engagement region, and the engagement region is at least 2 inches from at least one of the power plug prongs. In some embodiments, the engagement region is at least 3 inches from at least one of the power plug prongs.

In some embodiments, the apparatus further includes product packaging, wherein the housing and the bracket are provided in the product packaging. Some embodiments further include at least one screw provided in the product packaging, the screw being compatible with a mounting hole of the flange.

In a method according to some embodiments, a bracket is engaged with a rear surface of a housing, wherein the housing has a set of power plug prongs extending from the rear surface. The power plug prongs are plugged into an electrical outlet. After plugging the power plug prongs into the electrical outlet, at least one flange of the bracket is secured to a surface adjacent to the electrical outlet.

In some embodiments, the bracket includes at least two flanges, and the method further includes removing at least a portion of a flange along a frangible region thereof before plugging the power plug prongs into the electrical outlet.

In some embodiments, securing at least one flange of the bracket comprises driving a screw through a hole in the flange.

In some embodiments, securing at least one flange of the bracket comprises securing the flange to a framing member of a building, such as a wall stud.

BRIEF DESCRIPTION OF THE DRAWINGS

FIGS. 1A-1G are illustrations of a housing that may be used with a bracket according to some embodiments. FIG. 1A is a top view. FIG. 1B is a front view. FIG. 1C is a bottom view. FIG. 1D is a right side view. FIGS. 1E and 1F are front perspective views. FIG. 1G is a rear view of the housing according to some embodiments.

FIG. 2A is a top view. FIG. 2B is a front view. FIG. 2C is a rear view. FIG. 2D is a front perspective view.

FIGS. 3A-3D illustrate a bracket and a housing in an engaged configuration according to some embodiments. FIG. 3A is a front view. FIG. 3B is a front perspective view. FIG. 3C is a rear view. FIG. 3D is a rear perspective view.

DETAILED DESCRIPTION

Figure 1G:
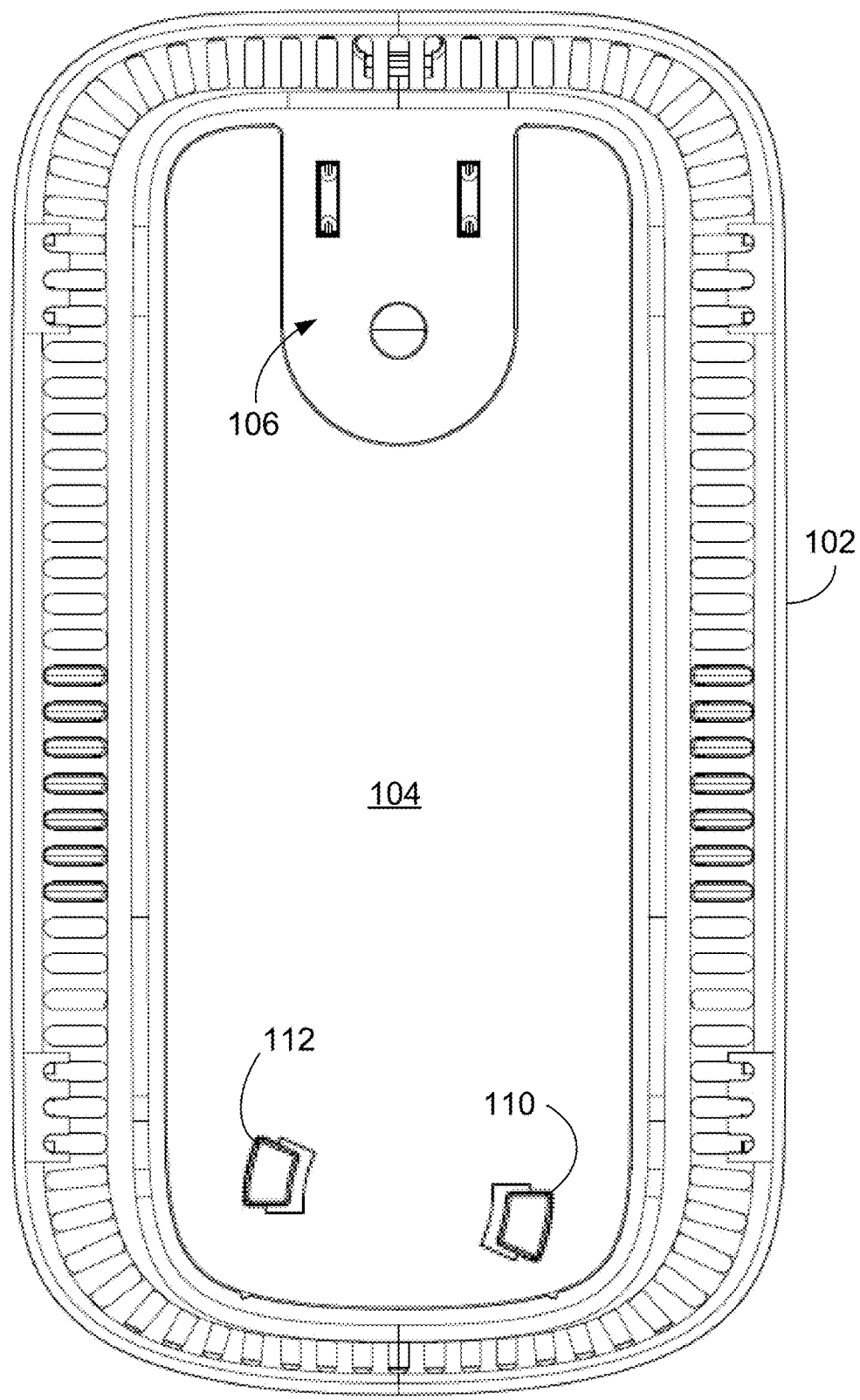
Figure 2A:
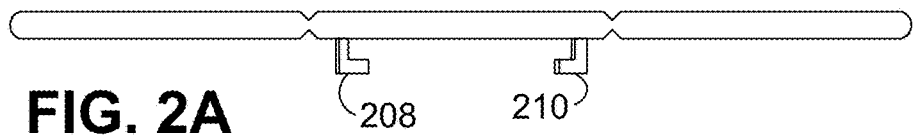
FIGS. 2A-2D are illustrations of a bracket that may be used with a housing according to some embodiments.
Figure 2B:
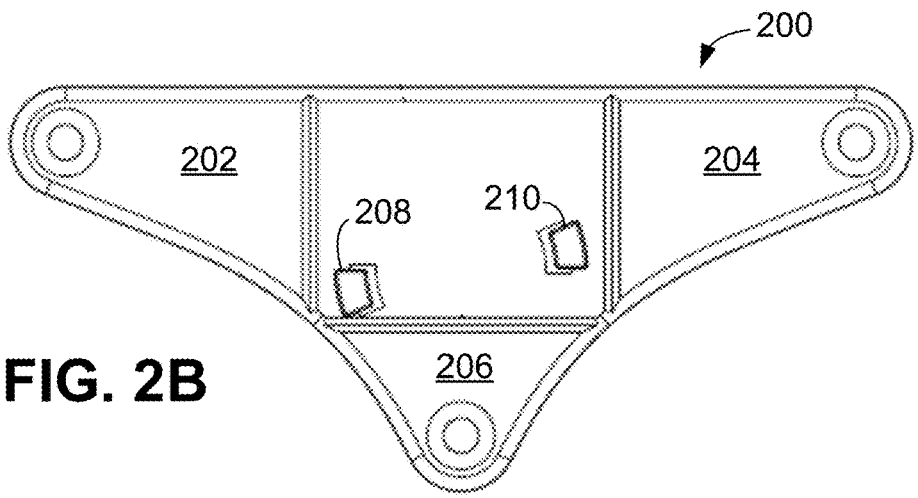
Figure 2C:
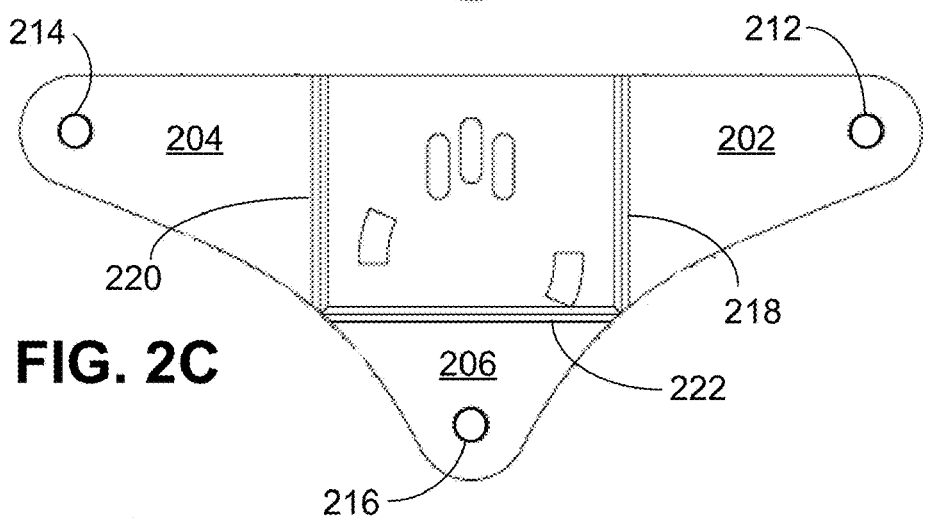
Figure 2D:
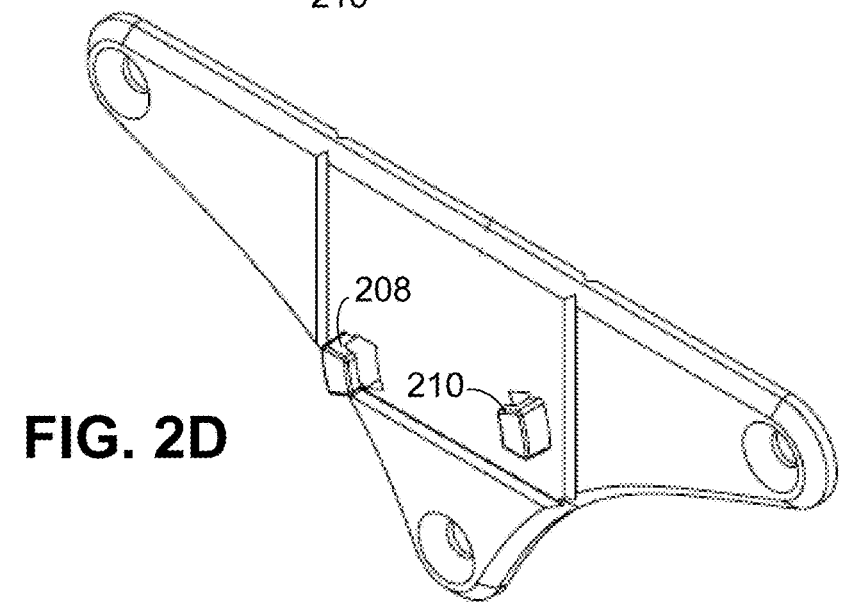

Example embodiments provide apparatus and methods to provide a rigid connection of an electronic device, such as a sensor node, with the underlying structure. Some embodiments may also provide for theft prevention or deterrence. In some embodiments, a bracket is provided. The bracket is designed to allow for mounting of the sensor node or other electronic device in four different orientations, which may be referred to as normal portrait, upside down portrait, left landscape ("bottom" of the device in left landscape extends to the left of the outlet the device is plugged into) and right landscape ("bottom" of the device in right landscape extends to the right of the outlet the device is plugged into). In some embodiments, the bracket includes scoring lines to enable parts to be broken or cut off to accommodate mounting challenges such as a wall or wall feature or fixture that is close to the outlet.

As illustrated in FIGS. 1A-1G, a device 100 includes a housing 108 having a perimeter 102 and a rear surface 104. A set of power plug prongs 106 extends from the rear surface of the housing. Although the illustrated prongs are those compatible with standard North American outlets, other configurations may alternatively be used.

In some embodiments, the device 100 may be a sensor node enclosed in the housing 108. The sensor node may include one or more sensors such as an accelerometer or other orientation or movement sensor, a thermometer, a hygrometer, a light sensor, a microphone, or other sensors. The device 100 may further include a processor configured to process sensor reading and a wireless communications module to communicate raw or processed sensor data.

As illustrated in FIGS. 2A-2D, a bracket 200 is provided. The bracket 200 is releasably engageable with the rear surface 104 of the housing. The bracket has at least one flange that extends beyond the perimeter 102 of the housing when the bracket is engaged with the rear surface. For example, the bracket 200 has three flanges, 202, 204, 206, although the number of flanges may be different in different embodiments.

In the example of FIGS. 1A-1G and 2A-2D, the releasable engagement between the housing 108 and the bracket 200 is a rotatable engagement. For example, the bracket 200 may be affixed to the rear surface 104 of the housing by relative rotation of the bracket 200 and the housing 108.

In some embodiments, the rotatable engagement is effected by providing on the bracket a first set of at least two projections 208, 210. The rear surface 104 of the housing includes a second set of at least two projections, 110, 112. The first set of projections in this embodiment is releasably engageable with the second set of projections. For example, through a relative rotational motion between the housing 108 and the bracket 200, projection 208 engages with projection 110, and projection 210 engages with projection 112.

Figure 7:
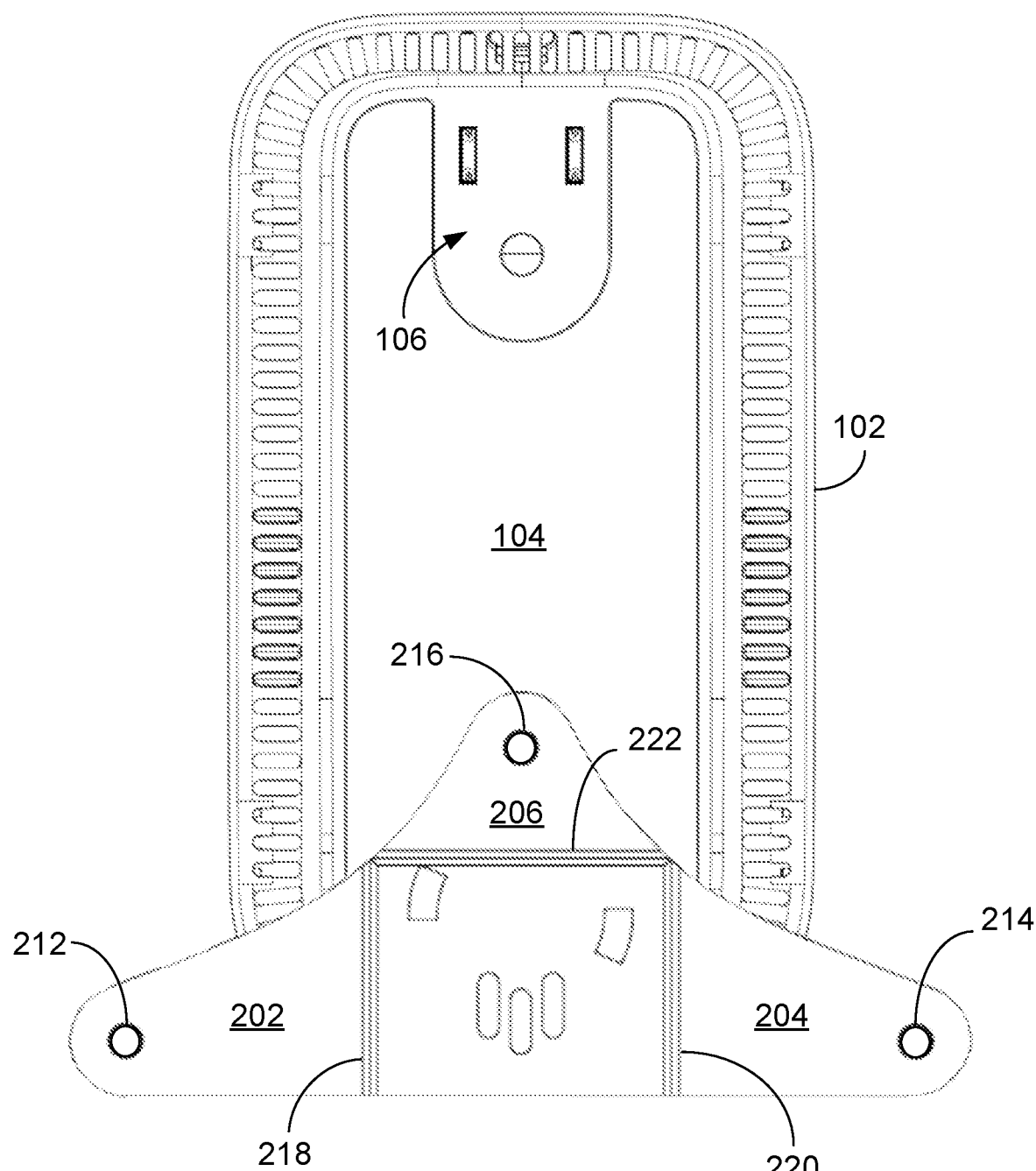
FIG. 7 is a rear view illustrating a bracket and a housing in another engaged configuration according to some embodiments.

FIGS. 3A-3D illustrate the housing 108 and the bracket 200 in an engaged configuration. In a first orientation as illustrated in FIGS. 3A-3D, the flange 206 extends beyond the perimeter 102 of the housing. In some embodiments, the bracket may also be configured to be engaged with the housing in a second orientation rotated by approximately 180° with respect to a first orientation. In such an arrangement, projection 208 engages with projection 112, and projection 210 engages with projection 110. This second orientation may be useful to conceal the flange 206 behind the housing if it is not needed. This second orientation is illustrated in FIG. 7.

In some embodiments, one or more of the flanges 202, 204, 206 include a respective mounting hole 212, 214, 216. The mounting hole may be capable of accepting a screw. As seen particularly in FIGS. 3A and 3C, the mounting holes may be at a position beyond the perimeter of the housing when the bracket is engaged with the rear surface. Such a configuration allows for easier access to any screws used in the mounting holes.

In some embodiments, such as the embodiments of FIGS. 2A-2D and 3A-3D, the bracket includes at least two flanges that extend beyond the perimeter of the housing when the bracket is engaged with the rear surface.

In some embodiments, at least one of the flanges includes a frangible region allowing for removal of at least a portion of the respective flange. For example, frangible regions 218, 220, and 222 are provided on bracket 200. In the example of FIGS. 2A-2D, the frangible regions include scoring lines in which the thickness of the bracket is reduced to allow for at least a portion of the corresponding flange to be snapped off, cut off, or otherwise removed. In alternative embodiments, the frangible region may include a perforation, a use of a weaker material, or other configuration that allows for selective removal (which may be permanent removal) of a portion of the respective flange.

The frangible regions may be positioned such that no portion of a removed flange is visible when the device 100 is mounted to a surface.

In some embodiments, as shown in FIG. 3A, the perimeter of the housing includes a first side edge 114, a second side edge 116, and a bottom edge 118, and the bracket includes three flanges including a first flange 202 that extends beyond the first side edge, a second flange 204 that extends beyond the second side edge, and a third flange 206 that extends beyond the bottom edge.

It should be noted that the terms "side" and "bottom" here are used with reference to the orientation of the apparatus as shown in the drawings. In actual use, as noted above, the device may be installed in various orientations. In some such orientations, the portions referred to here as "sides" may be oriented to the top or bottom, and the portion referred to as the "bottom" may be oriented to one side or toward the top. The terms "side" and "bottom" as used here do not exclude such orientations of the apparatus in use.

Figure 3D:
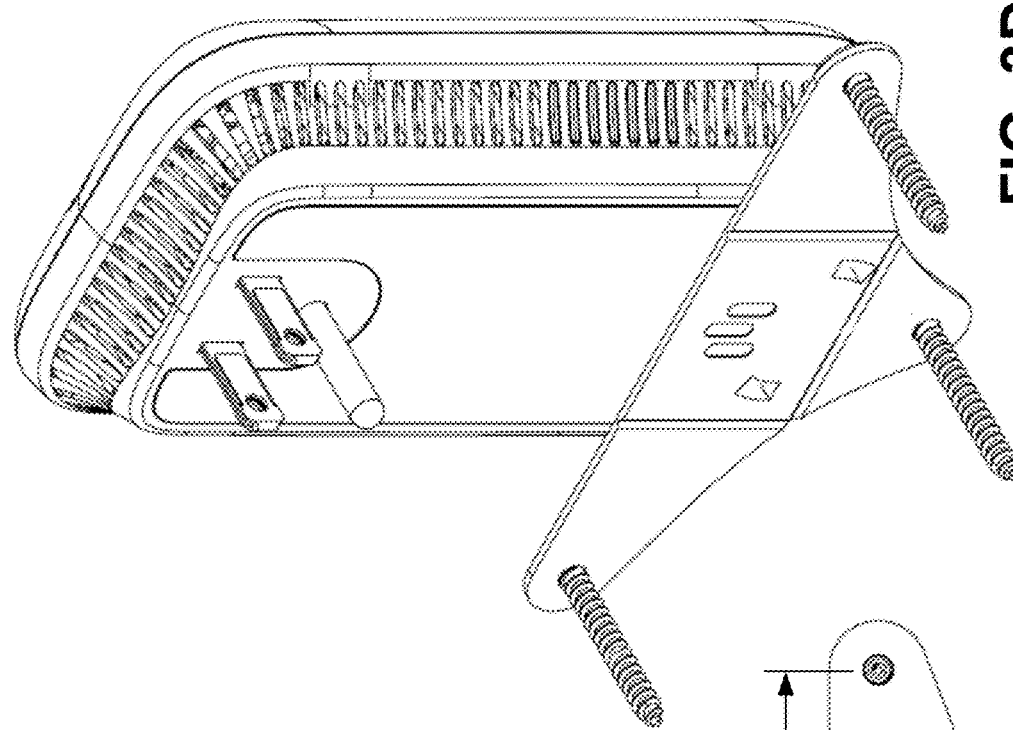
Figure 3C:
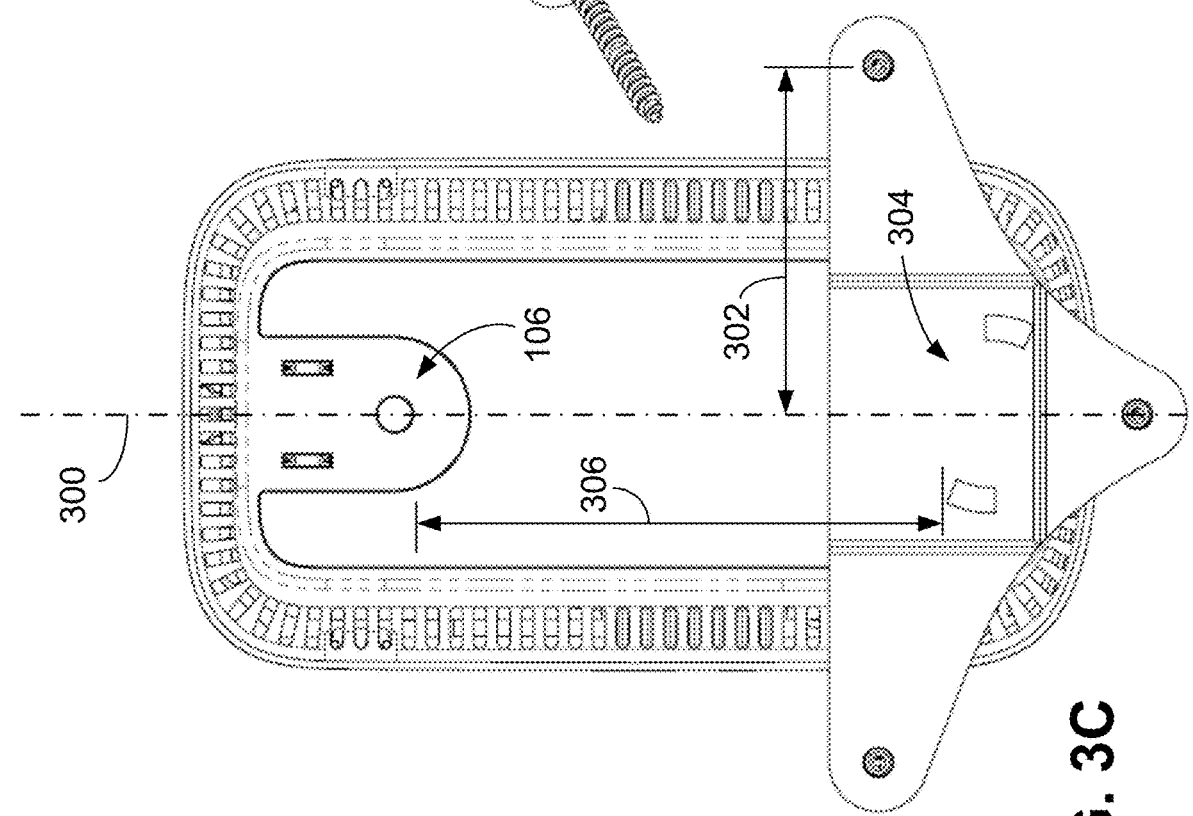

FIG. 3C illustrates a centerline 300 of the housing. The centerline may be defined by an axis of symmetry of the prongs of the power plug. (It is understood that the symmetry is not a perfect one as the "hot" and "neutral" prongs may have different sizes.) As noted above, one or more of the flanges may include a mounting hole, such as holes 212, 214, 216. In some embodiments, when the bracket is engaged with the rear surface, the mounting hole is between 1 inch and 2½ inches from the centerline of the housing, as indicated by distance 302. In a case where the device 100 is plugged into an electrical outlet that is mounted alongside a framing member of a building, such as a wall stud, such a positioning of the mounting hole increases the likelihood that a screw driven into the mounting hole will be driven into the framing member, thus providing a more secure connection. In some embodiments, the mounting hole is between 1¼ inches and 2¼ inches from the centerline of the housing. In some embodiments, two of the flanges on opposite sides of the centerline have distances from the centerline as described, allowing for engagement with a framing member situated on either side of an electrical outlet.

As illustrated in FIG. 3C, the bracket is engageable with the housing in an engagement region 304 that includes the projections or other features that effect the engagement. In some embodiments, the engagement region is at least 2 inches from at least one of the power plug prongs, as indicated by the distance 306. Greater distance between the power plug prongs and the engagement region decreases the amount of rotation that the device 100 undergoes as a result of play either at the power plug prongs (e.g. play within an electrical socket) or in the engagement region. Such reduced rotation due to play is particularly useful in cases where the device includes a motion or orientation sensor such as an accelerometer, because it increases the likelihood that any detected motion reflects motion of the surface on which the device is mounted rather than solely motion of the device itself. In some embodiments, to further reduce orientation changes due to play, the mounting region is at least 3 inches from at least one of the power plug prongs.

Figure 4A:
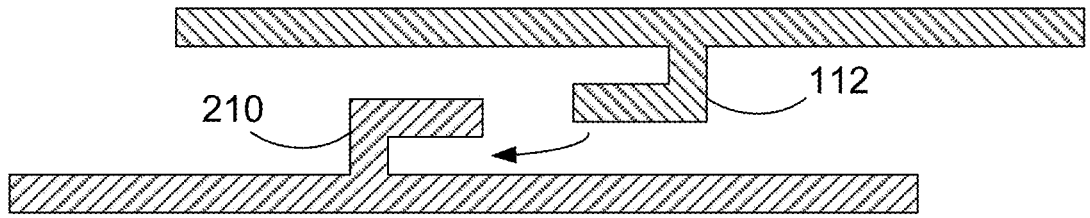
FIGS. 4A-4B are schematic cross-sectional views illustrating an engagement mechanism used in some embodiments.
Figure 4B:
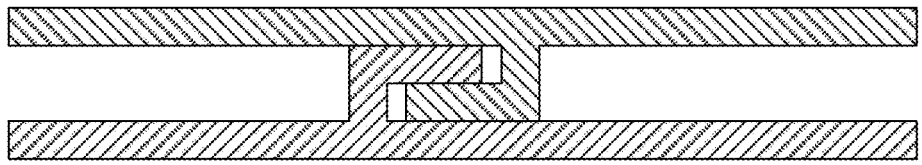
Figure 5A:
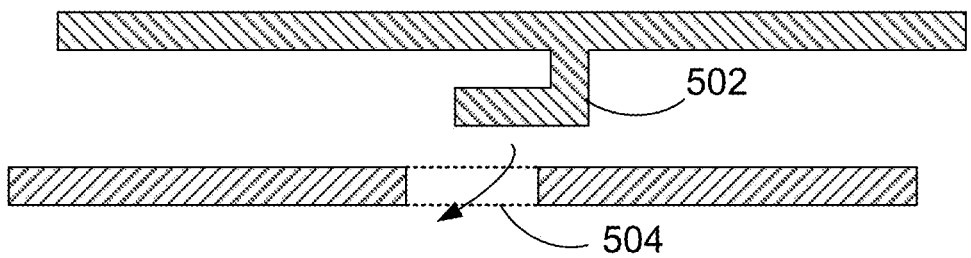
FIGS. 5A-5B are schematic cross-sectional views illustrating an engagement mechanism used in additional embodiments.
Figure 5B:
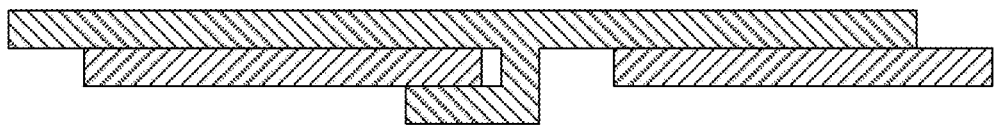

FIGS. 4A-4B are schematic cross-sectional views illustrating engagement between a projection of the bracket and a projection of the housing, using projections such as projection 112 of the housing and projection 210 of the bracket. In FIG. 4A, the projections are in a disengaged configuration, and in FIG. 4B, the projections are in an engaged configuration. FIGS. 5A-5B illustrate an alternative embodiment in which the bracket is provided with a projection 502 and the housing is provided with a hole 504 (or vice-versa). The projection 502 and the hole 504 are releasably engageable with one another. Other configurations for releasable engagement between the bracket and the housing may alternatively be used. In different embodiments, different numbers of projections and/or recesses may be used. In some embodiments as discussed above, the engagement can be effected through relative rotation of the bracket and the housing. However, in other embodiments, the engagement can be effected through a relative sliding motion between the bracket and the housing. In still further embodiments, a screw, latch, detent, or other mechanism may be used to releasably engage the bracket to the housing.

Figure 8:
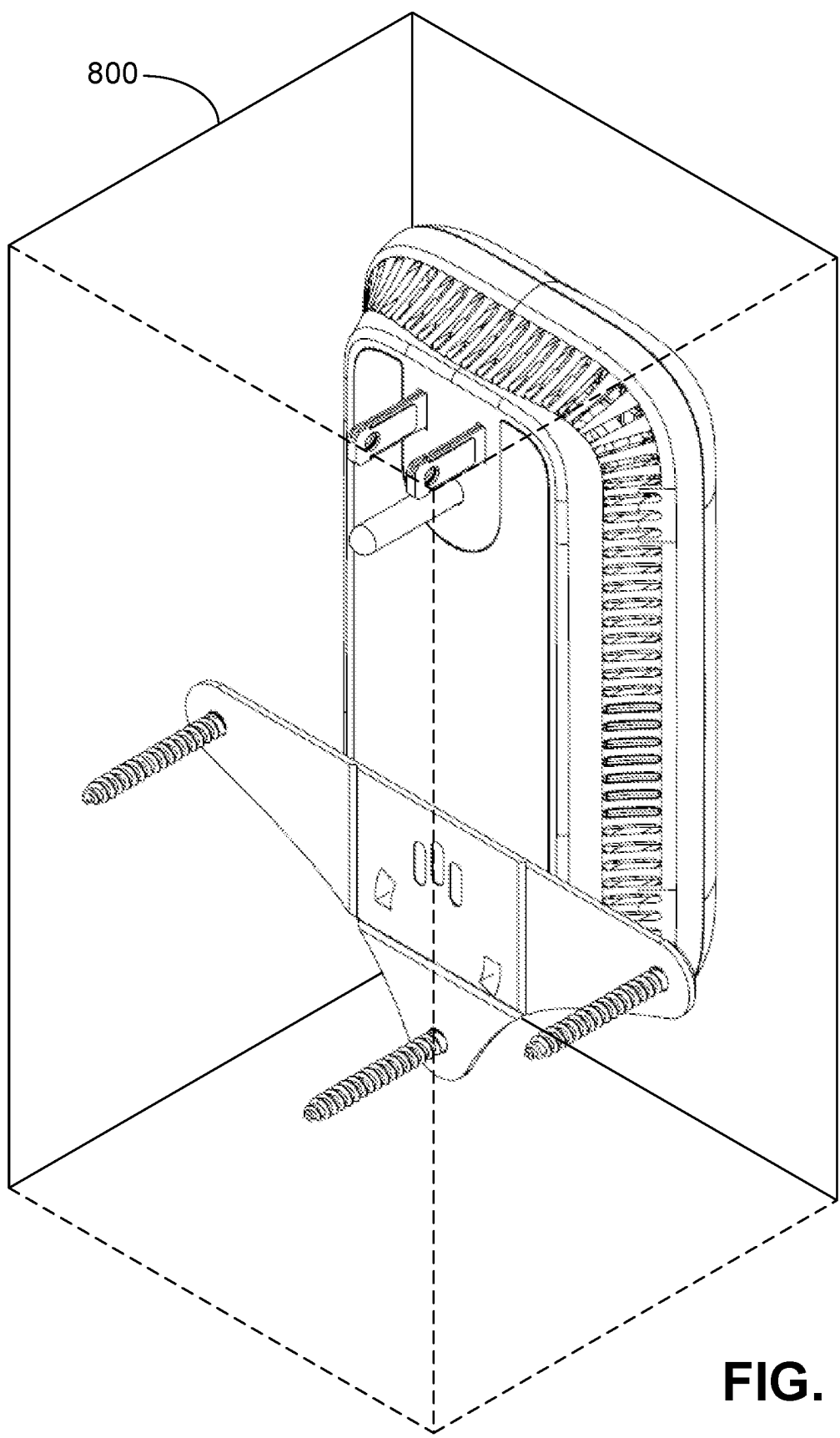
FIG. 8 is a rear perspective view illustrating the bracket and a housing of FIG. 3D in a box.

In some embodiments, the device 100 (including housing 108) and the bracket 200 are packaged together for sale, e.g. in the same product packaging such as a box 800 (FIG. 8), clamshell, or other type of packaging. In some embodiments, the packaging encloses one or more extra brackets (e.g. packaging containing more brackets than devices). In some embodiments, the packaging further encloses one or more screws that are compatible with a mounting hole of the flanges.

Figure 6:
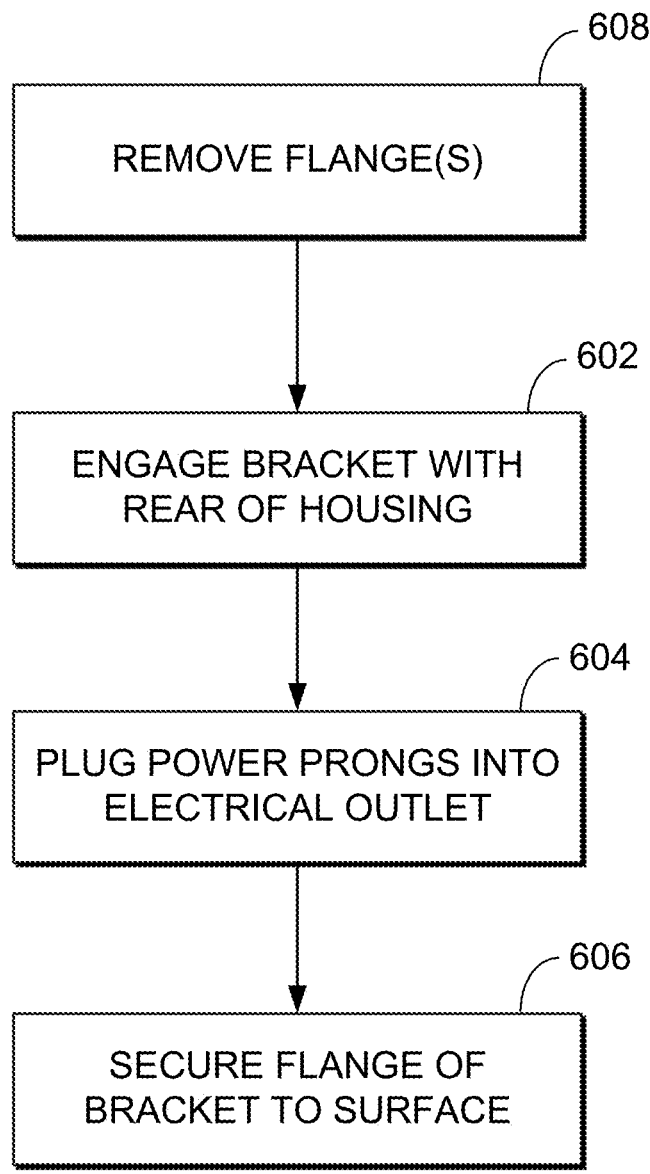
FIG. 6 is a flow diagram illustrating a method performed in some embodiments.

In a method according to some embodiments, as shown in FIG. 6, a bracket is engaged with a rear surface of a housing (602). The housing has a set of power plug prongs extending from the rear surface, and the power plug prongs are plugged into an electrical outlet (604). After plugging the power plug prongs into the electrical outlet, at least one flange of the bracket is secured to a surface adjacent to the electrical outlet (606). The surface may be, for example, a wall.

In some embodiments, where the bracket includes at least two flanges, the method further includes removing at least a portion of a flange along a frangible region thereof (608) before plugging the power plug prongs into the electrical outlet. Removal of a flange may be performed when, for example, a wall, molding, or other obstruction would otherwise prevent the device from being mounted in a desired position.

In some embodiments, securing at least one flange of the bracket (606) may be performed by driving a screw through a hole in the flange. Other techniques for securing the flange may alternatively be used. In some embodiments, securing at least one flange of the bracket comprises securing the flange to a framing member of a building. The framing member may be a wall stud. For example, the flange may be secured by driving a screw through a hole in the flange into a wall stud.

As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Other variations of the described embodiments are contemplated. The above-described embodiments are intended to be illustrative, rather than restrictive, of the present invention. The scope of the invention is thus not limited by the examples given above but rather is defined by the following claims.

The invention claimed is:

1. An apparatus comprising:
a housing having a perimeter and a rear surface;
a set of power plug prongs extending from the rear surface of the housing; and
a bracket releasably engageable with a rotatable engagement with the rear surface of the housing, the bracket being engageable to the rear surface of the housing by relative rotation of the bracket and the rear surface of the housing, the bracket having at least one flange that extends beyond the perimeter of the housing when the bracket is engaged with the rear surface, the flange including at least one mounting hole at a position beyond the perimeter of the housing when the bracket is engaged with the rear surface, the flange being positioned to prevent rotation of the bracket relative to the housing when mounted using the mounting hole;
wherein the power plug prongs are positioned to prevent rotation of the housing relative to the bracket when the power plug prongs are inserted in an electrical outlet.

2. The apparatus of claim 1, wherein the housing encloses a sensor node.

3. The apparatus of claim 2, wherein the sensor node includes at least one of the following: an accelerometer, a thermometer, a light sensor, and a microphone.

4. The apparatus of claim 1, wherein the bracket includes a first set of at least two projections, and wherein the rear surface of the housing includes a second set of at least two projections, the first set of projections being releasably engageable with the second set of projections to provide the rotatable engagement between the bracket and the rear surface of the housing.

5. The apparatus of claim 1, wherein the bracket is releasably engageable with the rear surface in at least two orientations.

6. The apparatus of claim 1, wherein the mounting hole is at a position beyond the perimeter of the housing to allow insertion of a screw through the mounting hole when the bracket is engaged with the rear surface.

7. The apparatus of claim 1, wherein the bracket includes at least two flanges that extend beyond the perimeter of the housing when the bracket is engaged with the rear surface, each of the flanges including at least one mounting hole at a position beyond the perimeter of the housing when the bracket is engaged with the rear surface.

8. The apparatus of claim 7, wherein at least one of the flanges includes a frangible region allowing for removal of at least a portion of the respective flange.

9. The apparatus of claim 8, wherein the frangible region comprises a scoring line.

10. The apparatus of claim 1, wherein the perimeter of the housing includes a first side edge, a second side edge, and a bottom edge, and wherein the bracket comprises three flanges including a first flange that extends beyond the first side edge, a second flange that extends beyond the second side edge, and a third flange that extends beyond the bottom edge.

11. The apparatus of claim 1, wherein, when the bracket is engaged with the rear surface, the mounting hole is between 1 inch and 2½ inches from a centerline of the housing, the centerline being an axis of symmetry of the set of power plug prongs.

12. The apparatus of claim 1, wherein, when the bracket is engaged with the rear surface, the mounting hole is between 1¼ inches and 2¼ inches from a centerline of the housing, the centerline being an axis of symmetry of the set of power plug prongs.

13. The apparatus of claim 3, wherein the bracket is engageable with the rear surface in an engagement region, and wherein the engagement region is at least 2 inches from at least one of the power plug prongs.

14. The apparatus of claim 3, wherein the bracket is engageable with the rear surface in an engagement region, and wherein the engagement region is at least 3 inches from at least one of the power plug prongs.

15. The apparatus of claim 1, further comprising product packaging, wherein the housing and the bracket are provided in the product packaging.

16. A method comprising:

engaging a bracket with a rear surface of a housing having a perimeter, wherein the housing has a set of power plug prongs extending from the rear surface, and wherein the bracket is releasably engageable with a rotatable engagement with the rear surface of the housing, the bracket being engageable to the rear surface of the housing by relative rotation of the bracket and the rear surface of the housing, the bracket having at least one flange that extends beyond the perimeter of the housing when the bracket is engaged with the rear surface, the flange including at least one mounting hole at a position beyond the perimeter of the housing when the bracket is engaged with the rear surface;

plugging the power plug prongs into an electrical outlet; and after plugging the power plug prongs into the electrical outlet, securing the flange of the bracket to a surface adjacent to the electrical outlet, the flange being positioned to prevent rotation of the bracket relative to the housing when mounted using the mounting hole;

wherein the power plug prongs are positioned to prevent rotation of the housing relative to the bracket when the power plug prongs are inserted in the electrical outlet.

17. The method of claim 16, wherein the bracket includes at least two flanges, and the method further comprising removing at least a portion of a flange along a frangible region thereof before plugging the power plug prongs into the electrical outlet.

18. The method of claim 16, wherein securing the flange of the bracket comprises driving a screw through the mounting hole in the flange.

19. The method of claim 16, wherein securing the flange of the bracket comprises securing the flange to a framing member of a building.

* * * * *